(12) United States Patent
Chernyakov et al.

(10) Patent No.: US 8,436,248 B2
(45) Date of Patent: May 7, 2013

(54) ELECTRICAL COMPONENT

(75) Inventors: Alexander Chernyakov, Munich (DE); Patric Heide, Vaterstetten (DE); Johann Heyen, Munich (DE); Thomas Von Kerssenbrock, Munich (DE)

(73) Assignee: EPCOS AG, Munich (DE)

( * ) Notice: Subject to any disclaimer, the term of this patent is extended or adjusted under 35 U.S.C. 154(b) by 604 days.

(21) Appl. No.: 11/997,764

(22) PCT Filed: Aug. 4, 2006

(86) PCT No.: PCT/DE2006/001368
§ 371 (c)(1),
(2), (4) Date: Apr. 3, 2008

(87) PCT Pub. No.: WO2007/016909
PCT Pub. Date: Feb. 15, 2007

(65) Prior Publication Data
US 2008/0212283 A1 Sep. 4, 2008

(30) Foreign Application Priority Data

Aug. 5, 2005 (DE) .......................... 10 2005 037 040

(51) Int. Cl.
*H05K 1/00* (2006.01)
(52) U.S. Cl.
USPC .......................................... 174/252; 174/262
(58) Field of Classification Search .................. 361/760, 361/709, 748; 174/260, 262, 252; 333/132, 333/185

See application file for complete search history.

(56) References Cited

U.S. PATENT DOCUMENTS

| 5,506,755 | A | 4/1996 | Miyagi et al. | |
| 6,097,268 | A | 8/2000 | Watanabe et al. | |
| 6,765,458 | B2 | 7/2004 | Yamaguchi | |
| 6,822,534 | B2 | 11/2004 | Uriu et al. | |
| 6,900,708 | B2* | 5/2005 | White et al. | 333/185 |
| 2002/0167783 | A1 | 11/2002 | Waffenschmidt et al. | |
| 2002/0171141 | A1 | 11/2002 | Ammar | |
| 2003/0128522 | A1* | 7/2003 | Takeda et al. | 361/715 |
| 2003/0231076 | A1 | 12/2003 | Takeuchi et al. | |
| 2004/0118602 | A1* | 6/2004 | Lee et al. | 174/260 |
| 2004/0203552 | A1 | 10/2004 | Horiuchi et al. | |
| 2004/0217914 | A1 | 11/2004 | Yamashita et al. | |
| 2005/0104685 | A1 | 5/2005 | Kuroki et al. | |
| 2006/0249754 | A1* | 11/2006 | Forman et al. | 257/208 |
| 2007/0013462 | A1* | 1/2007 | Fan | 333/185 |
| 2009/0283902 | A1* | 11/2009 | Bezama et al. | 257/713 |

FOREIGN PATENT DOCUMENTS

| DE | 10054968 | 5/2002 |
| DE | 102004016399 | 11/2004 |
| DE | 102004049984 | 9/2005 |

(Continued)

OTHER PUBLICATIONS

Chernyakov et al., "Miniature Fully—Integrated WLAN Frontend— Modules Based on LTCC Technology", Radio and Wireless Conference, 2004, IEEE, Sep. 19-22, 2004, pp. 139-142.

(Continued)

*Primary Examiner* — Yuriy Semenenko
(74) *Attorney, Agent, or Firm* — Fish & Richardson P.C.

(57) ABSTRACT

An electrical component that includes a substrate that includes at least one electrical circuit is described herein. The electrical component also includes a heat sink in an aperture through the substrate.

23 Claims, 4 Drawing Sheets

FOREIGN PATENT DOCUMENTS

| | | |
|---|---|---|
| EP | 0820155 | 1/1998 |
| EP | 1257156 | 11/2002 |
| EP | 0939449 | 12/2002 |
| EP | 1307078 | 5/2003 |
| EP | 1355432 | 10/2003 |
| GB | 2369013 | 5/2002 |
| JP | 06-013491 | 1/1994 |
| JP | 8-237165 | 9/1996 |
| JP | 10-32521 | 2/1998 |
| JP | 11-154804 | 6/1999 |
| JP | 11-312987 | 11/1999 |
| JP | 2000-185972 | 7/2000 |
| JP | 2001-211097 | 8/2001 |
| JP | 2003-087149 | 3/2003 |
| JP | 2003-100989 | 4/2003 |
| JP | 2003-133801 | 5/2003 |
| JP | 2003-204013 | 7/2003 |
| JP | 2004-064738 | 2/2004 |
| JP | 2004-297456 | 10/2004 |
| JP | 2005-079885 | 3/2005 |
| JP | 2005-094405 | 4/2005 |
| JP | 2005-123909 | 5/2005 |

OTHER PUBLICATIONS

Chernyakov et al., "Novel Small-Size LTCC-Based WLAN frontend-Modules with Integrated Power Amplifiers", Microwave Symposium Digest, 2004, IEEE, MTTS International, vol. 2, Jun. 6-11, 2004, pp. 559-562.

EPCOS AG "WKAN-LTCC Module: Verstarker integriet", Pressemeldung, Nov. 2004, www.epcos.de.

EPCOS AG "LTCC-Technologie: PaiD-Module Integrierten Power Amplifier", Pressemeldung, Aug. 2004, www.epcos.de.

EPCOS AG "Weltweit kleinstes Front-End-Modul fur WLAN", Pressemeldung, Jul. 2003, www.epcos.de.

Heide et al., "Highly Integrated LTCC Frontend-Modules for Bluetooth and WLAN Applications", 6th European Conference on Wireless Technology, Munich, 2003, pp. 359-562.

Heide et al., "Ultracompact Front-End Modules for WLANs", EPCOS Components, Jan. 2004, pp. 32-36.

Kryshtopin et al., "Novel High-Accuracy LTCC-integrated Power Monitors for 2,4 and 5 GHz Wireless-LAN Applications", IEEE Int. Microwave Symposium.

Lin et al., "Design of an LTCC Tri-Band Transceiver Module for GPRS Mobile Applications". IEEE Trans. On Microwave Theory and Techniques, Vo. 52, No. 12, Dec. 2004, pp. 2718-2724.

Sutono et al., "High Q LTCC—Based Passive Library for Wireless System—on Package (SOP) Module Development", IEEE Trans. On Microwave Theory and Techniques, vol. 49, No. 10, Oct. 2001, pp. 1715-1724.

International Search Report from corresponding PCT Application No. PCT/DE2006/001368, mailed Nov. 23, 2006.

Translation of Written Opinion for PCT/DE2006/001368.

Notification of Reasons for Refusal (type I office action), in JP Pat. Appl. No. 2008-524356, mailed Mar. 9, 2011, 2 pages.

Final Notification of Reasons for Refusal (type II office action), in JP Patent Application No. 2008-524356, mailed Nov. 25, 2011, 3 pages.

* cited by examiner

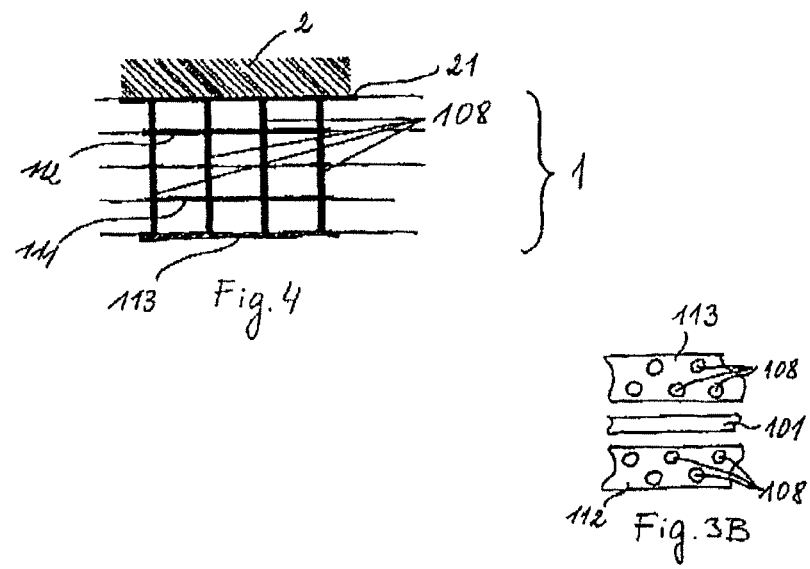
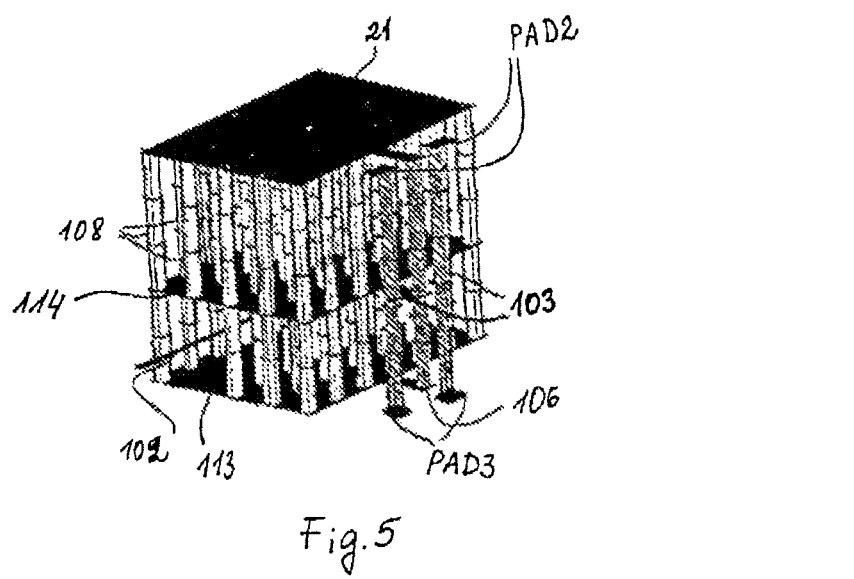

ELECTRICAL COMPONENT

CROSS REFERENCE TO RELATED APPLICATIONS

Pursuant to 35 USC §120, this application claims the benefit of PCT/DE2006/001368 filed Aug. 4, 2006 which claims the benefit of German Patent Application No. 102005037040.3 filed Aug. 5, 2005. Each of these applications is incorporated by reference in its entirety.

FIELD OF THE INVENTION

An electrical component that is applicable to the frontend of radio devices is specified.

BACKGROUND

Components applicable to radio devices are known from the following publications, for example: A. Chemyakov et al., "Novel Small Size LTCC Based WLAN Frontend Modules with Integrated Power Amplifiers," 2004 IEEE MTT-S Digest, pp. 559-562; U.S. Pat. No. 6,097,268, EP 0939449 A2, GB 2369013 A.

SUMMARY

One problem to be solved is to specify an electrical component having a small space requirement and high power compatibility.

An electrical component is specified, with a substrate through which a heat sink is led, wherein the heat sink is a component of a circuit realized in the substrate.

Leading through a substrate means, e.g., leading the heat sink in the substrate on the shortest path from top to bottom, i.e., vertical to the substrate plan, or from the upper side to the underside of the substrate.

The substrate is preferably a multilayer substrate with at least three metallization planes, wherein a dielectric layer is arranged between each two metallization planes. The dielectric layers can contain, for instance, ceramic, in particular an LTCC ceramic. LTCC stands for Low Temperature Co-fired Ceramics.

A complete circuit is realized in the device, comprising the following integrated functional units in a preferred variant: at least one antenna switch, crossovers, amplifier elements, filters, transformers for balancing the signal paths (baluns), optionally also directional couplers and an RF-power detector. The amplifier elements comprise transmit amplifiers and receive amplifiers.

The complete circuitry of the device comprises the circuit integrated into the substrate, which has function blocks formed in the substrate. The function blocks comprise, for example, a crossover block, an amplifier block, a filter block, and, if desired, a transformer block. The below-described function blocks are electroconductively connected to one another by connection lines.

The circuit integrated into the substrate comprises signal paths and the circuit elements arranged therein, such as LC filters, as well as crossovers, directional couplers, and baluns, as well as matching networks and/or impedance converters for matching the impedance of signal paths. The impedance converters are preferably integrated into the filters or baluns.

In the substrate the integrated circuit can be realized as an LC filter comprising the following components: at least one low-pass filter, at least one high-pass filter and at least one bandpass filter. The LC filters can comprise a high-pass filter, a low-pass filter, a bandpass filter and/or a balun, which can be components of a crossover—a diplexer or a duplexer. A diplexer is usually the combination of a low-pass filter and a crossover comprising a high-pass filter, which is suitable for separating signals of different frequency bands. A duplexer is a crossover which is suitable for separating transmit and receive signals of a frequency band.

The filters can be balanced, i.e., single-ended, and have a balanced gate.

The circuit further comprises electrical connections arranged in metallization planes of the substrate, as well as vertical electrical connections, in particular, connection lines between terminals arranged on the underside of the substrate and contact areas on the upper side of the substrate arranged for contacting the chip mounted on the upper side of the substrate. The circuit also comprises the connection lines between separate function blocks integrated into the substrate to be explained below. The circuit also comprises the connection lines between the chips and the function blocks.

The specified component comprises chips mounted on the substrate that are electrically connected to the integrated circuit inside the substrate. The chips can be mounted on the substrate by means of an electrically conductive adhesive layer, for example. The chips can, for instance, be connected by means of bond wires to contact surfaces arranged on the upper side of the substrate. The adhesive layer can also be electrically insulating. The chips comprise at least one chip, in particular, a semiconductor chip to be cooled with the aid of the heat sink during operation of the component.

At least one of the following components can be realized on the substrate: a changeover switch or an antenna switch, an RF power detector, transmit and receive amplifiers, a bandpass filter, a duplexer or a balun. The power detector for monitoring the power level of the transmit signal can comprise, for instance, at least one PIN diode. The switch or switches can comprise field-effect transistors in one variant. The antenna switch can be a GaAs switch. The bandpass filters and/or duplexers arranged on the substrate are chips operating with acoustic waves, for example.

The components arranged on the substrate can be bare-dies or housed chips. These chips can be surface-mountable. However, they can also be mounted on the substrate or electrically connected to it with flip-chip or bond wire technology. These components can be encapsulated by means of a cured molding compound, for example. However, they can also be arranged individually or jointly under a cover that seals tightly to the substrate surface.

In one advantageous variant, all passive elements such as bandpass filters, low-pass filters, high-pass filters, matching networks, diplexers and possibly duplexers can be integrated into the substrate in the form of LC elements.

The heat sink is thermally connected at the top to the chip to be cooled, e.g., a semiconductor chip, and at the bottom to a heat reservoir such as a highly thermally conductive body with a large surface area. The heat sink preferably serves to dissipate heat generated in the semiconductor chip, wherein an amplifier element, particularly at least one power amplifier PA arranged in a transmit path, is realized in the semiconductor chip. The heat sink is preferably arranged directly underneath this chip.

In particular, the electrical circuit comprises LC filters arranged in the signal paths. Circuit elements operating mainly capacitively, referred to below simply as capacitors, are preferably formed as conductive surfaces arranged one above the other. Circuit elements operating mainly inductively, referred to below simply as inductors, are preferably formed as narrow, elongated or folded conductor track sections or as plated through-holes arranged in the substrate.

In a multilayer component, the heat sink comprises at least one column of vertical electrical connections arranged one above the other, each arranged in a dielectric layer and conductively connecting two successive metallization planes. Several such columns arranged one along side the other are preferably present in a heat sink. These columns are also called plated through-holes.

The heat sink has a low thermal resistance. The plated through-holes of the heat sink have high thermal conductivity, e.g., at least two 250 W/mK, preferably at least 300 w/mK.

The plated through-holes of a heat sink preferably have a larger cross-sectional area than other plated through-holes arranged in the substrate, which are provided as vertical conductive connections but not as heat sinks.

The heat sink can be connected to a ground terminal arranged on the underside of the substrate and thus can serve as a ground connection of the amplifier element and/or the other chips arranged on the substrate or integrated into the substrate (the LC filters). The heat sink, which comprises several plated through-holes connected to ground, is suitable for electromagnetic shielding of a (signal-carrying) signal conductor. The signal conductor can he, for example, an HF connection, a control line, or a power supply line of the semiconductor chip.

The signal conductor is arranged at least in part in the area of the heat sink, preferably between the plated through-holes of the heat sink. The signal conductor to be shielded can comprise a conductor track section formed in a metallization plane and/or a vertical electrical connection, i.e., a plated through-hole. The signal conductor can be provided as an (additional) heat sink of the chip. This heat sink is connected to a signal-carrying terminal on the underside of the substrate.

The heat sink can be connected to a conductive surface buried in the substrate, preferably a ground surface, which then functions, on the one hand, as a heat spreader, i.e., to distribute the heat in the substrate volume, and on the other, as a local ground in the circuit of the component. This conductive surface can serve to form a capacitor, for example, particularly a multilayer capacitor, and/or to shield a signal conductor from above or below. A plated through-hole of the heat sink can conductively connect to ground surfaces arranged in different levels.

Two ground surfaces connected to the plated through-holes of the heat sink are preferably provided, between which the horizontal section of the signal conductor runs. The plated through-holes of the heat sink, preferably arranged a short distance apart, guarantee a shielding of the signal conductor on both sides.

The plated through-holes of the heat sink can be arranged the same distance away from the signal conductor. A distance between two plated through-holes of a heat sink is understood to be the minimum distance between the center axes of these plated through-holes. This distance is preferably not greater than three times the cross-sectional size of a plated through-hole of the heat sink.

In the substrate, an electrical line can be formed particularly a strip line or a micro-strip line, comprising the signal conductor and at least one ground conductor, which is preferably the conductive surface connected to the heat sink. The electrical line, particularly its vertical sections, can also comprise the plated through-holes of the heat sink. The vertical sections of the electrical line are explained below. The ground conductor, the plated through-holes of the heat sink and/or the signal line can each be integrated into the already mentioned LC filter or can be a component of a matching network. The line can also comprise matching stubs and/or branch lines.

A conductor track section provided for forming an inductor can be connected to the heat sink and/or to this conductive surface. It is thus possible to form an LC filter in which the heat sink preferably acts as an inductively functioning element.

A heat sink that comprises several plated through-holes arranged around a vertical signal conductor is advantageous. The signal conductor running vertically, i.e., parallel to the plated through-holes of the heat sink, is a signal-carrying plated through-hole. This arrangement can be compared to a coaxial line with a signal carrier shielded by a tubular ground conductor. A hexagonal arrangement of plated through-holes around the signal conductor is also possible. Thus the vertical signal conductor is shielded essentially on all sides in a lateral plane.

The different plated through-holes of the heat sink take on electrical functions by 1) serving as the local ground of an LC filter and contributing inductive or capacitive effects, 2) being the ground conductor of an RF line and/or 3) serving as a shield between adjacent signal conductors.

Several heat sinks, each fulfilling a different electrical function, can also be provided in the substrate. For example, a first column can serve as an inductor in an LC filter, at least one second column can serve to lead an RF signal through, a third column can serve to lead a supply potential through, and several fourth columns can serve for electromagnetic shielding of a signal conductor arranged between the fourth columns.

In one variant, the plated through-holes of a heat sink form at least one row, wherein the distance between each two successive plated through-holes in the row is essentially equal.

The conductive surface and the signal conductor can lie in the same metallization plane. In one variant, two conductive surfaces, between which the signal conductor is arranged, can be provided in one metallization plane. This is a strip line known as a coplanar line.

The conductive surface and the signal conductor can also be arranged in different metallization planes one above the other, however. In one variant, two conductive surfaces one above the other can be provided, between which the signal conductor is arranged. This is a micro-strip line known as a triplate line.

In principle, any desired electrical line can be realized by the combination of one or more conductive surfaces connected to the heat sink and a signal line lying opposite the latter. The plated through-holes of the heat sink guarantee an additional shielding of the signal line in comparison to conventional strip lines.

The signal conductor can have both a horizontal and a vertical section. Then a cutout for passage of the vertical sections of the signal conductor is preferably provided in the conductive surface that is arranged above or below the horizontal running section of the signal conductor.

In a preferred variant, the elements of a function block are compact and spatially delimited from the elements of other function blocks. It is also possible however, for at least two function blocks to be arranged in a common volume, wherein their elements are distributed in this volume but are not delimited from the elements of other functional blocks.

The crossover block comprises for instance, diplexers, duplexers, directional couplers and connection lines leading to the antenna switch, including RF signal lines, DC supply lines and control lines via which control signals are supplied to the switch. The diplexers and the duplexers can each consist of LC filters. In an advantageous variant, this block is arranged underneath an antenna switch and/or an RF detector.

The filter block comprises the LC filters integrated in the substrate that are arranged in the receive and transmit paths of the component. In one variant, the filter block can comprise the crossover block.

The amplifier elements comprise the power amplifiers PA arranged in the transmit paths and the low-noise amplifiers LNA arranged in the receive paths.

The amplifier block is arranged underneath the amplifier elements and comprises the RF signal lines leading to them, DC lines for supplying power to the amplifier elements and control lines provided to drive the amplifiers, particularly vertical electrical connections. In one variant the amplifier block also comprises the already-explained heat sink. This heat sink can be integrated into the filter block for forming capacitively or inductively functioning circuit elements, for example. Due to the electrical interaction of the amplifier block and the LC filter block, it is possible to keep the overall volume of the substrate particularly low.

The transformer block comprises baluns, and, for balanced filters, can be realized in the filter block, for instance. The baluns can also be formed in a separate function block, however.

In place of the separate blocks, chosen from the crossover block, the filter block and the transformer block, an LC filter block comprising the crossovers and the LC filters can be provided, in principle. The LC filter block can also comprise baluns and/or directional couplers. The LC filters can comprise balanced filters, in which case a separate transformer block with baluns is superfluous.

A separate substrate area is preferably assigned to each function block, wherein the facing boundary areas of adjacent function blocks can interact with one another electromagnetically. In one variant, the substrate volume is subdivided such that each of 1) the amplifier block, 2) the LC filter block with the crossovers, the directional couplers and the LC filters, and 3) the transmitter block occupies roughly one-third of the substrate volume.

Additionally, an electrical multiband element is specified that comprises a substrate and amplifier elements arranged thereon. The substrate comprises an amplifier block and an LC filter block comprising an LC filter. The volume of the LC filter block is, at most, twice as large as that of the amplifier block.

Due to the relatively small volume selected for the LC filter block, it is possible to provide a particularly compact highly-integrated component.

At least two of the LC filters can be associated with a crossover. The other LC filters can be arranged in the signal paths, each associated with one frequency band of the component.

In one variant, the volume of the LC filter block is, at most, ⅔ of the overall volume of the substrate.

The volume of the LC filter block in a preferred variant is, at most, as large as that of the amplifier block, or amounts to, at most, half the overall volume of the substrate. This is possible, for instance, with a relatively high dielectric constant $\epsilon_r \geq 15$.

Additionally, an electrical component is specified that comprises outer conductive surfaces arranged in parallel planes one above the other, between which a central conductive surface and a second conductor track are arranged. A first conductor track is arranged between the central conductive surface and one of the outer conductive surfaces. The distance between the second conductor track and each of the outer conductive surfaces is greater than the distance between the first conductor track and the opposing conductive surface.

The outer conductive surfaces are preferably conductively connected to the central conductive surface and to ground, for example.

The first conductor track preferably forms a conductive surface that forms a first capacitor with the first outer conductive surface and a second capacitor with the central conductive surface. An additional first conductor track can be provided that forms a third capacitor with the second outer conductive surface and a fourth capacitor with the central conductive surface. The two first conductor tracks, the central conductive surface and the outer conductive surfaces are arranged one above another in parallel planes. The two first conductor tracks are conductively connected to one another by means of a plated through-hole. The first conductor tracks form a first electrode of a multilayer capacitor. The outer conductive surfaces and the central conductive surface then form a second electrode of this multilayer capacitor.

The second conductor track is preferably formed by a conductor track section functioning mainly inductively that has an elongated and/or folded section. The second conductor track is arranged between the outer conductive surfaces and is shielded by them upwards and downwards. Together with the respective outer conductive surfaces, it forms a parasitic capacitance that is particularly small because the distance between these mutually facing conductive structures is selected to be comparatively large. If the second conductor track and the central conductive surface are formed in one plane, this distance is roughly twice as large as that between the facing conductive surfaces that are provided to formed a multilayer capacitor and that are associated with different electrodes of this capacitor.

Several second conductor tracks can also be provided, which are arranged, for instance, in a metallization plane. They can also be arranged in different planes, however, and then have different distances away from the outer conductive surfaces. Here, it is always essential that the inductively functioning conductor tracks, as components of the circuit in the vertical direction, be farther away from the ground surfaces than the conductive surfaces that are provided to form multilayer capacitors with these ground surfaces.

The components of the circuit that were just described—the multilayer capacitor and the inductor—can, in particular, realize opponents of an LC filter. The heat sink can also be integrated into this LC filter. It is possible, for instance, to connect conductively the central and the outer conductive surfaces by means of a plated through-hole associated with the heat sink.

The specified component is preferably provided as a highly-integrated frontend module. In particular, a multi-band/multimode circuit can be realized in the component, preferably at least in part in the substrate. Signal paths for the 2.4 GHz band (2.4 . . . 2.5 GHz) and the 5 GHz band (4.95 . . . 5.8 GHz) can be realized in the circuit of the component The frontend module can be provided as a WLAN module, and in one variant as a dual-band/triple-mode module. Such a module transmits, amplifies and transforms transmit and receive signals, and blocks interference signals between WLAN transceiver ICs and antennas.

Preferably at least one filter, one amplifier and one balun are provided in the respective signal path for each frequency band. The signal path can be a transmit path or a receive path. A low-pass filter or a bandpass filter and a power amplifier are preferably arranged in the transmit path. A bandpass filter and a low-noise amplifier are preferably arranged in the receive path. The switching between these signal paths and the antenna terminals is performed by means of the switch and the crossovers.

The component can be realized as an SMD component. SMD stands for surface mounted device. The footprint of the component is chosen to be between 6×6 mm$^2$ and 8×8 mm$^2$.

The number and thickness of the dielectric layers, as well as the overall thickness of the substrate, is preferably selected such that an efficient heat dissipation by the heat sink is possible. The number of dielectric layers can be 3 to 15 for instance, or even more. The thickness of the layers in one variant lies between 35 and 150 µm. The dielectric constant of the dielectric layers can be between 5 and 200, for instance. The height of the component in one variant, determined by the overall thickness of the substrate, is preferably ≦1.5 mm, at most 1 mm. The space savings in comparison to conventional frontend solutions from discrete components can be up to 90%. This is advantageous, particularly for applications in mobile radio terminals and handheld multimedia devices.

The electrical component will be explained below on the basis of schematic figures not drawn to scale.

DETAILED DESCRIPTION

Figure 1:
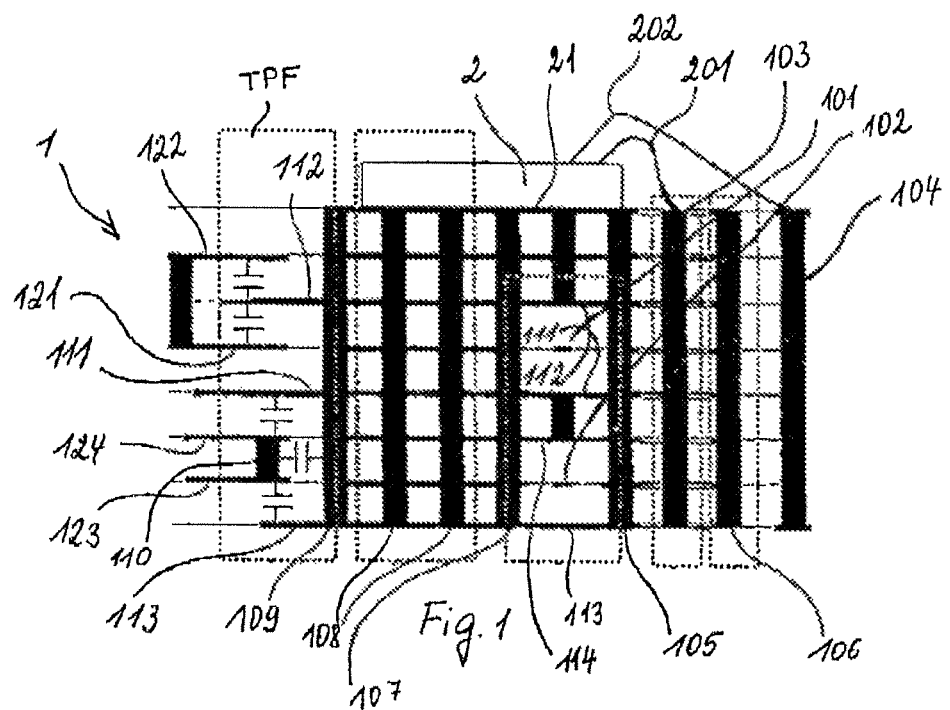
FIG. 1 shows a part of a cross section of the component with the substrate and heat sinks arranged therein, FIG. 2, an example of a heat sink that comprises several plated through-holes, wherein a single conductor runs in the area of the heat sink, FIG. 3A, a heat sink, the plated through-holes of which are arranged around the vertical signal conductor and shield it, FIG. 3B, a coplanar line, the ground conductors of which are connected to the plated through-holes of the heat sink, FIG. 4, the area of the heat sink that is coupled at the top to a chip, FIG. 5, the area of the heat sink in which a signal conductor runs, FIG. 6, a section of an LC filter with inductively and capacitively functioning circuit elements that is integrated into the substrate of the component, FIG. 7, an example of a realization of an LC filter, FIG. 8, the equivalent circuit diagram of the highly integrated frontend module according to FIG. 9, and FIG. 9, a perspective view of the module according to FIG. 8.

FIG. 1 shows a cross section of the component with several heat sinks which fulfill various electrical functions in the circuitry of the component.

The component comprises a substrate 1 with ceramic layers arranged one above the other and metallization planes arranged therebetween, which are conductively connected by means of plated through-holes 103-110 to one another and to the uppermost and lowermost metallization plane of substrate 1.

Figure 9:
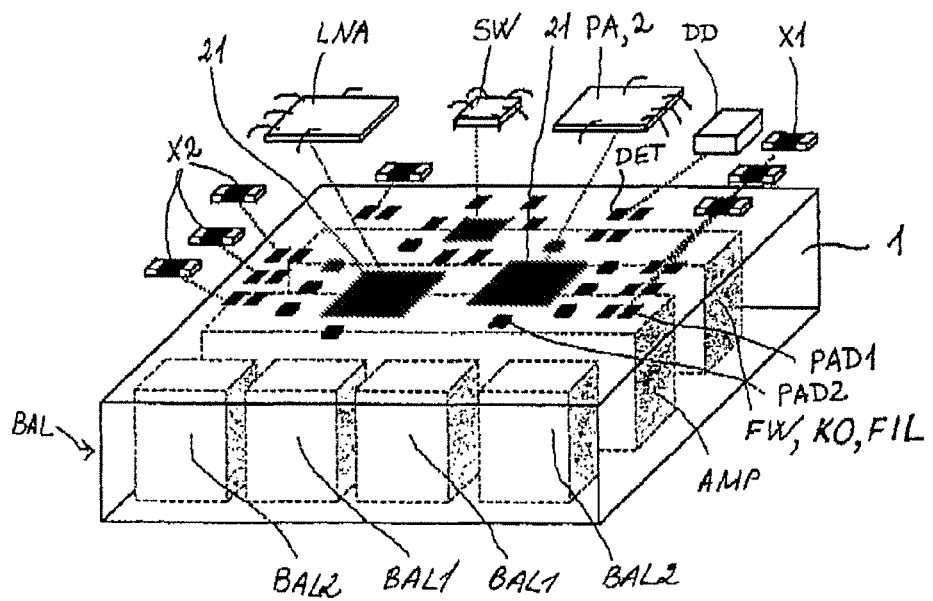

In the uppermost metallization plane, arranged on the upper side of substrate 1, contact surfaces PAD1, PAD2, DET are formed for connection of chips 2, PA, LNA, DD, SW, X1, X2 mountable on substrate 1 (FIGS. 5, 9). In the lowermost metallization plane, arranged on the lower side of substrate 1, external terminals PAD3 (FIG. 5) of the element are formed, which form in one variant an SMD-compatible interface to the circuit board that carries substrate 1 and the WLAN transceiver chip.

Substrate 1 comprises a circuit integrated therein that is electrically connected to the contact surfaces and the external terminals, and heat sinks 103-109 arranged therein, which are integrated into this circuit as circuit components. The component further comprises an amplifier element 2 mounted on it, which is electrically coupled by means of its bond wires 201, 202 to plated through-holes 103, 104 and therefore to the circuitry of substrate 1. Plated through-hole 103 or 104 can be, but need not be, a heat sink.

A heat sink that comprises plated through-holes 105, 107, 108, 109 passing through the substrate from top to bottom is formed in the substrate. These plated through-holes are connected in different metallization planes to ground surfaces 113, 114, 112, 111, and other ground surfaces. This heat sink is coupled electrically and thermally at the top by means of a relatively large-surface, highly thermally conductive layer 21 to amplifier element 2, and at the bottom (see FIG. 4), by means of the likewise highly thermally conductive and preferably also large-surface layer 113, to a circuit board (motherboard), not shown in FIGS. 1, 4. This circuit board preferably serves as a carrier for the specified component (e.g., the LTCC module), an IC (e.g., WLAN transceiver-baseband IC), the antennas connectable to antenna terminals ANT1, ANT2, and the connection lines between these components. The circuit board can also serve as a cooling element for the chip on the upper side of substrate 1 that is to be cooled.

Thermally conductive layer 21, which is preferably provided as an electrical contact surface as indicated in FIG. 9, has a larger surface area in FIG. 1 than that of bare-die chip 2. It is also possible, particularly with an SMD chip 2, to arrange the SMD terminals of the chip in relatively small peripheral areas of its underside and to arrange a highly thermally conductive coupling surface for thermal coupling to the heat sink in the relatively large-surface central area of the underside of the chip.

Plated through-holes 103-109 are connected at the top to contact surfaces PAD2 provided for connection of a chip to be mounted on the substrate, or to thermally conductive layer 21, and at the bottom, to contact surfaces PAD3 that serve as external terminals of the component. In the variant shown in FIG. 1, plated through-holes 105, 107, 108, 109 and 106 are connected at the bottom to a common ground terminal. It is also possible, however, to connect plated through-holes 106 and optionally 105 to a separate ground terminal. In principle, plated through-hole 109 can be connected to a separate ground terminal.

Plated through-hole 109 is a part of a low-pass filter TPF, wherein an inductive connection is realized between conductive surfaces 111, 112 and 111, 113, respectively. Plated through-hole additionally 109 forms a capacitor with an opposing plated through-hole 110, which conductively connects conductive surfaces 123 and 124 arranged one above the other.

Figure 6:
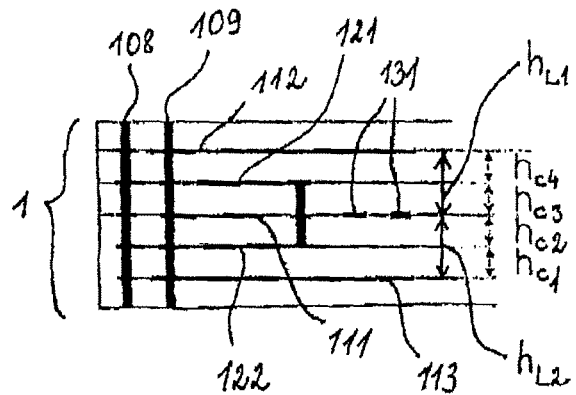

The conductive surfaces in FIGS. 1 and 6, arranged one above the other and subjected to different electrical potentials, form a capacitor in the sense of the specified device. In filter TPF, capacitors are (deliberately) formed between the superimposed parts of the following conductive surfaces: 113 and 123, 124 and 111, 111 and 121, 121 and 112, 112 and 122. A T-arrangement with two series resonant circuits in series branches and a capacitor connected to ground is realized by surfaces 113, 123, 124, 111 and plated through-holes 109, 110 in FIG. 1.

Conductive surfaces 121 and 122 are likewise conductively connected by means of a plated through-hole. Surfaces 121, 112 and 122 form a multilayer capacitor, wherein surfaces 121 and 122 are assigned to the first electrode and surface 112 to the second electrode of this multilayer capacitor.

Figure 3A:
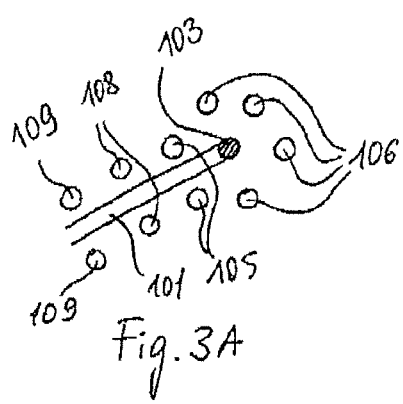

Signal lines 101, 102, 103 are arranged in the area of the heat sink, each of horizontal signal lines 101 and 102 being arranged in its own metallization plane. Vertical signal line 103 is formed as a plated through-hole. It is indicated In FIG. 3A that a signal line 101, 103 can have both a horizontal section 101 and a vertical section 103. Both sections 101, 103 are arranged in FIG. 3A between plated through-holes 105, 106, 108, 109, respectively, of the heat sink.

In the variant according to FIG. 1, signal line 101 together with the ground surfaces 113 and 114, and signal line 102 together with the ground surfaces 111 and 112 each form a triplate signal line. Alongside their function as a heat sink, plated through-holes 107 and 105 are provided for shielding signal lines 101 and 102 from the sides. Plated through-holes 105, 106 are arranged around vertical signal line 103; see also FIG. 3A.

The spacing between the adjacent plated through-holes of a heat sink is preferably equal. The diameter of the plated through-holes provided as a heat sink is preferably larger than that of conventional, i.e., electrical plated, through-holes arranged in substrate 1, e.g., plated through-hole 110.

The ceramic layers contained in substrate 1 are preferably of equal thickness. Different layer thicknesses of successive ceramic layers are also possible.

Figure 2:
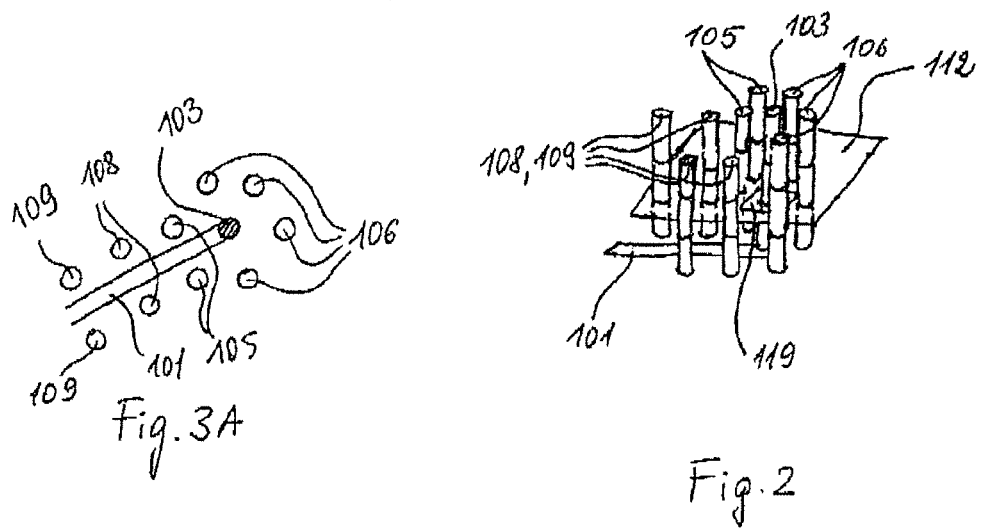

An arrangement of plated through-holes 105, 106, 108, 109, which together form a heat sink and are connected to a ground surface 112, is shown schematically in FIG. 2. An opening 119 for passage of vertical section 103 of signal line 101, 103 is provided in ground surface 112.

A coplanar line comprising two ground surfaces 112, 113 and a horizontal signal line 101 arranged between them is shown in FIG. 3B. Plated through-holes 108 of the heat sink are connected to ground surfaces 112, 113.

FIG. 5 shows a perspective view of the area of the heat sink according to FIG. 1. Ground surfaces 113, 114 each serve as a local ground and a heat spreader. Plated through-holes 103 are shielded from one another by plated through-hole 106. Signal line 102 is shielded by plated through-holes 108.

Figure 7:
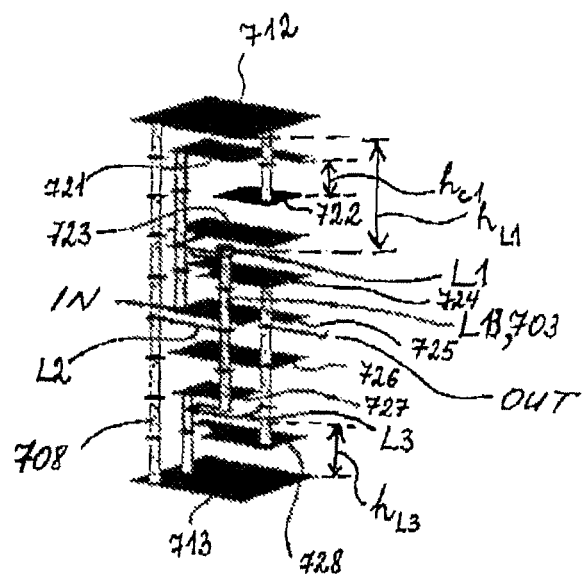

An advantageous LC filter integrated into substrate 1 is explained in FIGS. 6 and 7. This filter is preferably integrated into the device according to FIG. 1.

Ground surfaces 113, 111 and 112 are arranged one above the other and are all connected to ground by means of plated through-hole 109. The ground surfaces form a first electrode of a multilayer capacitor. Conductive surfaces 121 and 122, opposing surfaces 111 and 112 and 111 and 113, respectively, are additionally conductively connected to form this multilayer capacitor. Surfaces 121, 122 form a second electrode of the multilayer capacitor.

An inductor is realized by means of a conductor track 131 between the external ground surfaces 112, 113.

The spacing between the condenser plates, i.e., conductive surfaces 113 and 122, 122 and 111, 111 and 121, and 121 and 112, respectively, is $h_{C1}$, $h_{C2}$, $h_{C3}$ and $h_{C4}$. The spacing between conductor track 131 and conductive surface 112 and between conductor track 131 and conductive surface 113, respectively, is $h_{L1}$ and $h_{L2}$. Since conductor track 131 is arranged in the same plane as central ground surface 111 and the spacing between the metallization planes is equidistant, the distances $h_{L1}$ and $h_{L1}$ are twice as large as distances $h_{C1}$-$h_{C4}$ between the condenser plates. Thus the stray capacitance formed between the ground surfaces and conductor track 131 is comparatively small.

Conductor track 131 can be folded in a spiral or meandering shape. Several such conductor tracks can be provided in one plane. A transformer coupling of these inductors can be realized by means of conductor track sections arranged one alongside the other that are associated with different inductors.

As in FIG. 1, plated through-holes 108, 109 in FIG. 6 are preferably associated with the heat sink.

FIG. 7 shows the perspective view of an example of an LC filter. Ground surfaces 712 and 713, which are conductively connected by means of plated through-hole 708, are respectively arranged in the highest (first) and the lowest (tenth) metallization plane. Plated through-hole 708 therein is preferably provided as a heat sink. An additional ground surface 722, which is arranged in the third metallization plane from the top, is connected to ground surface 712. Another ground surface 728, which is arranged in the eighth metallization plane, is connected to ground surface 713.

Conductive surfaces 728, 726 and 724 arranged one above the other are conductively connected. Conductive surfaces 725 and 721 are likewise conductively connected. Surfaces 713, 728, 727 and 726 form a multilayer capacitor connected to ground. This also applies to surfaces 722, 721 and 712. Surfaces 726, 725 and 724 form a multilayer capacitor inserted into the series branch, i.e., between input IN and the output OUT of the filter.

An inductor L1, L13 is formed by a conductor track section L1 and a part of plated through-hole 703 connected to it. Another inductor L3, L13 is formed by a conductor track section L3 and a part of plated through-hole 703. A conductor track section L2, which connects plated through-holes 703 and 708 and, together with them, forms an inductor to ground, is additionally formed in the sixth metallization plane.

It is evident in FIG. 7 that the plates of a capacitor, e.g., surfaces 722, 721 are arranged in sequential metallization planes, so that the spacing between these surfaces is equal to the thickness of the dielectric layer. On the other hand, two metallization planes are provided between line section L1, arranged in the fourth level from the top, to form an inductor and the opposing ground surface 712, so that the spacing $h_{L1}$ between line section L1 and surface 712 is equal to three times the thickness of the dielectric layer or three times the spacing $h_{C1}$, if all metallization planes are equidistantly arranged. Spacing $h_{L3}$ between line section L3 and lower ground surface 713 is equal to twice the thickness of the dielectric layer. Thus, the stray capacitance formed between line section L1 and surface 712, and between line section L3 and surface 713, respectively, is very small.

Figure 8:
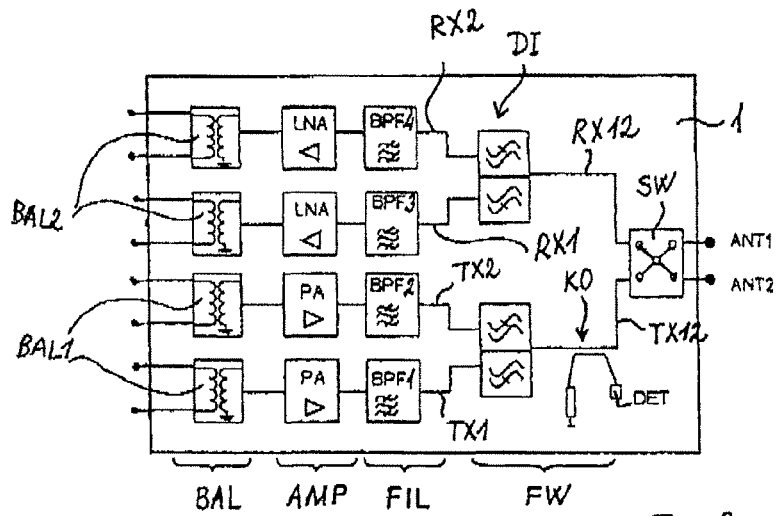

The circuit according to FIG. 8 is suitable for a dual-band device with a first band (4.9-5.85 GHz) and a second band (2.4-2.5 GHz). Transmit and receive paths of the two bands are connected as follows to antenna terminals ANT1, ANT2: 1) ANT1 to path RX12 and ANT2 to path TX12, or 2) ANT2 to path RX12 and ANT1 to path TX12. It is possible to switch between these two conditions (antenna diversity).

During data communication in the first or second band, the antenna ANT1 and ANT2 is connectively connected by means of antenna switch SW to a common receive path RX12 or transmit path TX12, respectively. A diplexer is arranged in each of the common paths RX12, TX12. Diplexers DI are provided for separating the transmit signals (or receive signals) of the two frequency bands. Each diplexer comprises a low-pass filter and a high-pass filter and is preferably completely integrated into substrate 1. Arrangement of diplexers on the substrate can also be considered if necessary.

The receive signals (or the transmit signals) of the first band are directed by means of the appropriate high-pass filter into first receive path RX1 (or first transmit path TX1). The receive signals (or the transmit signals) of the second band are directed by means of the appropriate low-pass filter into second receive path RX2 (or second transmit path TX2). A path RX1, RX2, TX1, TX2 is thus selected by means of antenna switch SW and the crossover, implemented here as a diplexer.

A directional coupler KO can be, but need not be, provided in the specified device. The directional coupler is arranged between antenna switch SW and diplexer DI arranged in path TX12. A part of the transmit signal is decoupled at an RF-power detector DD, comprising a detector diode or several interconnected diodes, by directional coupler KO in order to monitor the transmitting power.

In each path TX1, TX2, RX1, RX2 a bandpass filter BPF1, BPF2, BPF3 or BPF4, an amplifier PA or LNA and a balun BAL1 or BAL2 are arranged one after the other. The baluns, optionally comprising a filter that comprises or is realized in a filter, each serve to symmetrize the normally single-ended input and output gates of amplifiers LNA, PA, and in one variant, to match the amplifier connections to the interface of the WLAN transceivers.

Bandpass filters BPF3, BPF4 arranged in the receive paths allow the suppression of GSM, PCS and DCS signals. The higher harmonics in transmit paths TX1, TX2 are suppressed by the low-pass filters arranged in these paths. These low-pass filters, and high-pass filters for the suppression of the signals of local oscillators, are not shown in FIG. 8.

The circuitry shown in FIG. 8 comprises a circuit having the following function blocks: a crossover block FW, a filter block FIL, an amplifier block AMP and a transformer block BAL. In the variant shown in FIG. 9, crossover block FW and filter block FIL are realized as one function module—the LC filter block, which also comprises directional coupler KO. The function blocks are realized in substrate 1. In the variant according to FIG. 9, each function block 1) FW, FIL, KO, 2) AMP and 3) BAL is assigned its own area of substrate 1.

Crossover block FW comprises the two diplexers DI and/or the directional coupler KO and the electrical load connected to them. This block can also comprise filters not shown in FIG. 8, which are arranged in common transmit path TX12 or common receive path RX12.

Filter block FIL comprises bandpass filters BPF1-BPF4 realized in substrate 1 and/or the electrical connections leading to bandpass filters BPF1-BPF4 arranged on substrate 1. Amplifier block AMP comprises heat sink 103-109 and the RF or DC connections leading to amplifier chips PA, LNA. Transmitter block BAL comprises baluns BAL1, BAL2 and/or the electrical connections leading to baluns BAL1, BAL2 arranged on substrate 1.

Chips SW, PA, LNA, DD, X1, X2 are located on upper side of the substrate. Contact areas PAD1 are provided for electrical connection to chips X1, contact areas PAD2, 21 for connection to chip PA, 2 and contact area DET for connection to chip DD.

At least one semiconductor switch, the antenna switch, is integrated into chip SW. It is additionally possible to arrange different switches in a common chip.

At least one power amplifier is integrated into chip PA. It is possible to arrange each of the power amplifiers in different transmit paths TX1, TX2 in a separate chip. It is also possible to arrange the power amplifiers in different transmit paths in a common chip, as in FIG. 9. This also applies to chip LNA with low-noise amplifiers arranged in receive paths RX1, RX2.

A power detector, e.g., at least one PIN diode, is realized in chip DD. Components such as coils or bandpass filters BPF1 -BPF4, which are arranged in first transmit and receive paths TX1, RX1, respectively, are realized in chips X1. Components, which are arranged in second transmit and receive paths TX2, RX2, respectively, are realized in chips X2. Bandpass filters BPF1-BPF4 can alternatively be LC filters integrated into substrate 1.

Chips PA, SW and LNA in the variant shown in FIG. 9 are available as bare dies, chips X1, X2 as SMD chips and chip DD as a housed chip. Chip DD can be mounted with flip-chip technology or by means of SMD on contact areas DET of substrate 1.

The embodiment of the components of the circuitry shown in the schematic diagram of FIG. 8 is not limited to the variant according to FIG. 9. It is understood that arbitrary components of this circuitry can be realized in arbitrary types of chips, e.g., bare dies, housed chips, SMD chips. In one variant, it is possible to forgo at least one functionality or the associated structural block of the module presented in FIGS. 8 and 9. All passive function blocks of the module are preferably integrated into the substrate. In particular, matching networks of any type can be integrated to adjust the impedance of the respective function block of the device, in particular, to adjust the input and output impedance of a signal path in the substrate.

The invention claimed is:

1. An electrical component comprising:
   a substrate comprising at least one electrical circuit;
   a heat sink in a plated through-hole that extends through the substrate;
   a first horizontal signal line in a first metallization plane in the substrate; and
   a second horizontal signal line in a second metallization plane in the substrate;
   wherein the heat sink provides an electrical signal path; and
   wherein the heat sink in the plated through-hole that extends through the substrate forms a vertical electrical signal path between the first horizontal signal line and the second horizontal signal line.

2. The electrical component of claim 1, wherein the electrical circuit is an LC filter.

3. The electrical component of claim 1, wherein the substrate comprises a buried signal carrying conductive surface and the heat sink is electrically connected to the buried signal carrying conductive surface.

4. The electrical component of claim 3, wherein the buried conductive surface comprises a ground surface.

5. The electrical component of claim 1, wherein the substrate comprises:
   a plurality of metallization planes including a first metallization plane and a second metallization plane; and
   a dielectric coating between the first metallization plane and the second metallization plane.

6. The electrical component of claim 5, wherein the dielectric coating comprises a ceramic coating.

7. The electrical component of claim 1, wherein the heat sink comprises a plurality of parallel plated through-holes electrically connected to an electrical potential.

8. The electrical component of claim 7, wherein the plated through-holes are in a row and a spacing between two successive plated through-holes in the row is substantially the same.

9. The electrical component of claim 7, further comprising a signal line between the plated through-holes of the heat sink.

10. The electrical component of claim 9, further comprising a conductive surface, wherein the signal line and the conductive surface are formed in the substrate.

11. The electrical component of claim 9, wherein at least one section of the signal line is in a metallization plane of the substrate.

12. The electrical component of claim 11, wherein a buried conductive surface in the substrate and the signal line are in the same metallization plane.

13. The electrical component of claim 11, wherein a buried conductive surface in the substrate and the signal line are in different metallization planes.

14. The electrical component of claim 11, wherein the substrate includes a first conductive surface and a second conductive surface and the signal line is between the first conductive surface and the second conductive surface with the first conductive surface, the signal line, and the second conductive surface each being in different metallization planes.

15. The electrical component of claim 9, wherein at least one section of the signal line is parallel to the plated through-holes and forms at least one section of an electrical line.

16. The electrical component of claim 15, wherein a buried conductive surface in the substrate includes opening for a vertical section of the signal line.

17. The electrical component of claim 9, wherein at least one of a buried conductive surface in the substrate and the signal line is included in a filter in the substrate.

18. The electrical component of claim 1, further comprising an amplifier on the substrate, wherein the heat sink is configured to dissipate heat from the amplifier.

19. The electrical component of claim 1, further comprising at least one of a changeover switch, a transmit amplifier, a receive amplifier, a power detector, a bandpass filter, a duplexer, and a balun on the substrate.

20. The electrical component of claim 1, further comprising at least one of a low-pass filter, a high-pass filter, a diplexer, a bandpass filter, a duplexer, a balun, and a directional coupler in the substrate.

21. The electrical component of claim 1, wherein the electrical component comprises a multiband WLAN frontend module.

22. The electrical component of claim 7, further comprising additional plated through-holes in the substrate, wherein a cross-sectional size of the plated through-holes of the heat sink is greater than a cross-sectional size of the additional plated through-holes.

23. The electrical component of claim 1, further comprising:
a signal carrying terminal on an underside of the substrate, the signal carrying terminal being electrically connected to the heat sink in the plated through-hole.

* * * * *

UNITED STATES PATENT AND TRADEMARK OFFICE
CERTIFICATE OF CORRECTION

| | |
|---|---|
| PATENT NO. | : 8,436,248 B2 |
| APPLICATION NO. | : 11/997764 |
| DATED | : May 7, 2013 |
| INVENTOR(S) | : Alexander Chernyakov et al. |

It is certified that error appears in the above-identified patent and that said Letters Patent is hereby corrected as shown below:

Title Page 2, Column 1, item (56), Other Publications, line 29, delete "WKAN-LTCC" and insert -- WLAN-LTCC --

Signed and Sealed this
First Day of October, 2013

Teresa Stanek Rea
*Deputy Director of the United States Patent and Trademark Office*